(12) United States Patent
Nummer et al.

(10) Patent No.: US 9,716,507 B1
(45) Date of Patent: Jul. 25, 2017

(54) DLL CALIBRATION METHOD FOR FAST FREQUENCY CHANGE WITHOUT RE-LOCKING

(71) Applicant: TAIWAN SEMICONDUCTOR MANUFACTURING COMPANY, LTD., Hsinchu (TW)

(72) Inventors: Muhammad Nummer, Ottawa (CA); Rob Abbott, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 15/098,750

(22) Filed: Apr. 14, 2016

(51) Int. Cl.
*H03L 7/10* (2006.01)
*H03L 7/099* (2006.01)

(52) U.S. Cl.
CPC ............ *H03L 7/105* (2013.01); *H03L 7/0991* (2013.01)

(58) Field of Classification Search
CPC ............................. H03L 7/105; H03L 7/0991
USPC ....... 327/141, 142, 144, 145, 149, 150, 152, 327/153, 158, 159, 161, 261, 276
See application file for complete search history.

(56) References Cited

U.S. PATENT DOCUMENTS

| | | | |
|---|---|---|---|
| 8,368,437 B2 | 2/2013 | Huang et al. | |
| 8,456,207 B1 | 6/2013 | Kuo et al. | |
| 8,547,151 B2 | 10/2013 | Kuo et al. | |
| 8,570,082 B1 | 10/2013 | Kuo et al. | |
| 8,593,189 B1 | 11/2013 | Yen et al. | |
| 8,754,685 B1 | 6/2014 | Nummer et al. | |
| 8,890,626 B2 | 11/2014 | Chen et al. | |
| 9,065,454 B2 | 6/2015 | Lin | |
| 9,112,507 B2 | 8/2015 | Chen et al. | |
| 2006/0171497 A1* | 8/2006 | Kim | G11C 7/1072 375/376 |
| 2013/0285722 A1 | 10/2013 | Chou | |
| 2014/0145771 A1* | 5/2014 | Nummer | H03L 7/0994 327/159 |
| 2015/0162921 A1 | 6/2015 | Chen et al. | |
| 2015/0194971 A1 | 7/2015 | Tsai | |
| 2016/0112055 A1* | 4/2016 | Mirajkar | H03L 7/095 327/158 |

* cited by examiner

*Primary Examiner* — William Hernandez
(74) *Attorney, Agent, or Firm* — Hauptman Ham, LLP

(57) ABSTRACT

A delay circuit includes a delay line configured to output an output signal by imposing a delay value on an input signal. The delay circuit further includes an arithmetic unit configured to calculate a control code for the delay value based on delay codes. The delay circuit further includes a delay locked loop (DLL) configured to generate the delay codes based on a clock signal. The delay circuit further includes a controller configured to suspend operation of the DLL when the clock signal operates at a first frequency, to set the DLL to operate based on a second frequency when the DLL is suspended, and to resume operation of the DLL when the clock signal operates at the second frequency without the need to relock the DLL.

20 Claims, 4 Drawing Sheets

DLL CALIBRATION METHOD FOR FAST FREQUENCY CHANGE WITHOUT RE-LOCKING

RELATED APPLICATIONS

The present application is related to U.S. application Ser. No. 13/687,423, entitled "Delayed Locked Loop," filed on Nov. 28, 2012, now U.S. Pat. No. 8,754,685, and the entirety of which is herein incorporated by reference.

BACKGROUND

DDR stands for double data rate. Physical DDR interfaces (PHYs) are implemented using accurate timing when various signals, such as clock, command, address, and data signals are each launched. Incoming signals are also delayed to be captured. In some existing approaches, delay lines are used to delay such signals. The delay lines are compensated against manufacturing process variation, supply voltage variation, and temperature (PVT) variation.

In high speed operations of the DDR PHYs, such as operations in the range of Giga-bits per second, delay locked loops are used to calibrate the delay lines. Different ways of calibration are used. For example, calibration is performed once when the circuit is initialized or is performed continuously during operations of the circuits when the signals drift during circuit operations. Further, when semiconductor chips that have DDR interfaces and related circuits are manufactured on a printed circuit board, board artifacts, such as trace length mismatches, are also compensated for.

In some applications, switching between high performance and low power modes involves changing operating frequencies. When operating frequencies of DDR interfaces change, delay locked loops relock to the new clock frequency and the operation of locking to the new clock frequency can take hundreds of clock cycles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
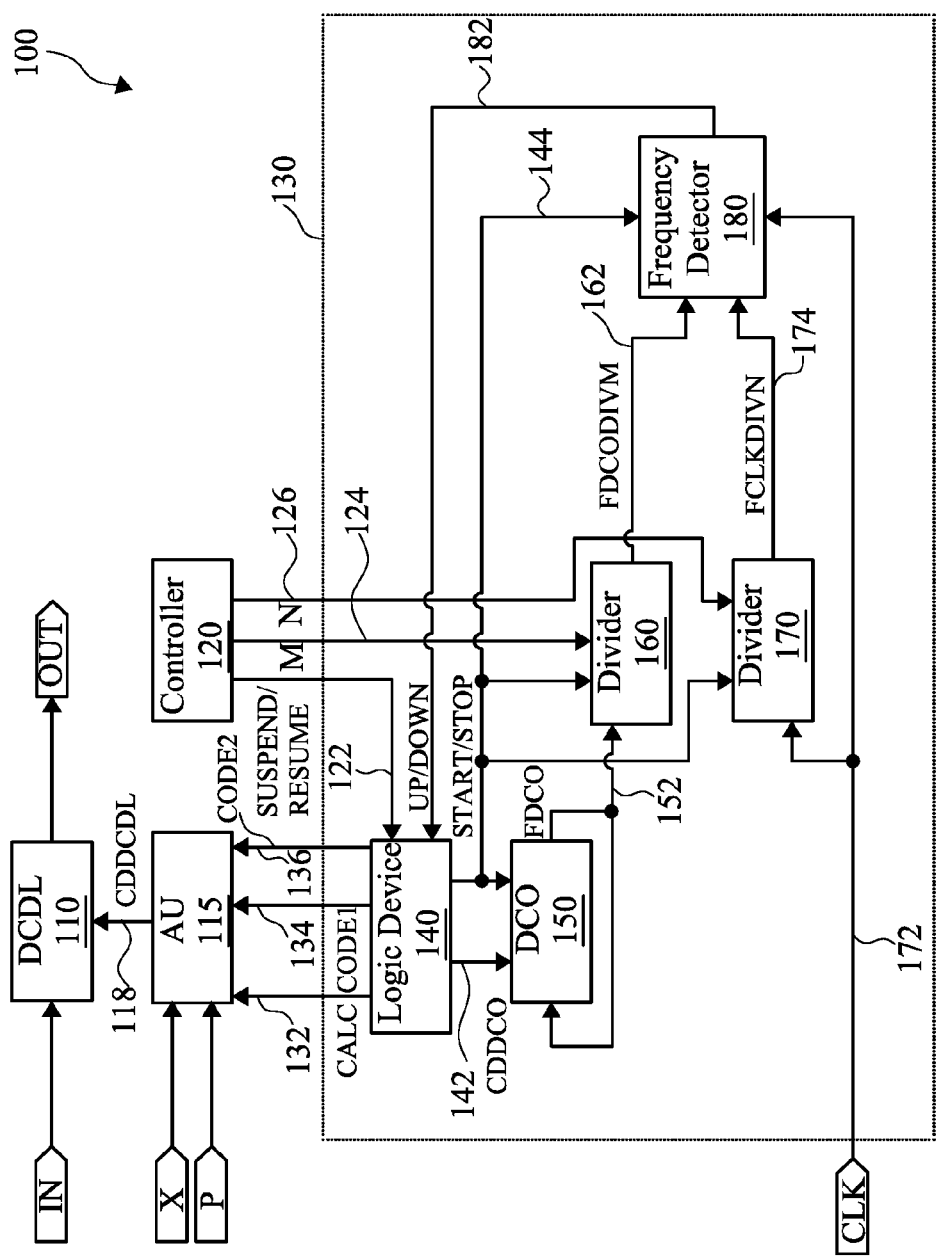
FIG. 1 is a block diagram of a delay circuit, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A digitally controlled oscillator (DCO) and a phase alignment mechanism are used in a delay locked loop (DLL). The DLL includes a fast frequency calibration method that enables the DLL to change delays based on the operating frequency without performing a frequency relocking operation. This calibration method allows the DLL to be locked to a first clock frequency and quickly switch to a second clock frequency, thereby allowing the device to enter and exit different performance modes to conserve power. Further, because the DLL does not require a frequency relocking operation, there are increased opportunities for a system to utilize low power modes without negatively impacting performance.

FIG. 1 is a block diagram of a delay circuit 100, in accordance with some embodiments. Circuit 100 is also called a DLL circuit because circuit 100 includes a DLL 130. In FIG. 1, a signal path is depicted as a single line for clarity. In some embodiments, a signal path in FIG. 1 is implemented by one or more corresponding signal lines.

Delay circuit 100 includes a digitally controlled delay line (DCDL) 110 that receives an input signal IN on an input terminal and outputs an output signal OUT from an output terminal. DCDL 110 is also coupled to an arithmetic unit (AU) 115 via signal path 118. In some embodiments, delay circuit 100 includes more than one DCDL 110, each of which is coupled to AU 115. Delay circuit 100 also includes a controller 120 coupled to DLL 130 via signal paths 122, 124, and 126. In some embodiments, controller 120 is an application processor for controlling operations of a system. In some embodiments, controller 120 is another circuit capable of controlling DLL 130 via signal paths 122, 124, and 126.

DLL 130 includes a logic device 140, a digitally controlled oscillator (DCO) 150, a first divider 160, a second divider 170, and a frequency detector 180. A first output terminal of logic device 140 is coupled to a first input terminal of DCO 150 via signal path 142. A second output terminal of logic device 140 is coupled to a second input terminal of DCO 150, a first input terminal of divider 160, a first input terminal of divider 170, and a first input terminal of frequency detector 180 via signal path 144. Logic device 140 is coupled to AU 115 through signal paths 132, 134, and 136.

An output terminal of DCO 150 is coupled to a second input terminal of divider 160 and to a third input terminal of DCO 150 via signal path 152. An output terminal of divider 160 is coupled to a second input terminal of frequency detector 180 via signal path 162. A second input terminal of divider 170 and a third input terminal of frequency detector 180 are coupled to a clock input terminal of DLL 130 via signal path 172. An output terminal of divider 170 is coupled to a fourth input terminal of frequency detector 180 via signal path 174. An output terminal of frequency detector 180 is coupled to an input terminal of logic device 140 via signal path 182.

DCDL 110 is configured to receive an input signal IN and to output an output signal OUT by imposing a predetermined delay on input signal IN. To impose the predetermined delay, DCDL 110 is configurable based on a digital control code CDDCDL received via signal path 118 from AU 115. In some embodiments, the electrical characteristics of DCDL 110 vary due to manufacturing process, supply voltage, and temperature. Effectively, by adjusting digital control code CDDCDL, circuit 100 is able to delay input signal IN by the predetermined delay regardless of manufacturing process, supply voltage, and temperature.

AU 115 receives a delay setting parameter X on a first input terminal and a delay setting parameter P on a second input terminal. AU 115 also receives a signal CALC on signal path 132, a signal CODE1 on signal path 134, and a signal CODE2 on signal path 136. In response to receiving signal CALC from logic device 140, AU 115 calculates control code CDDCDL based on control code CODE1, control code CODE2, and delay setting parameters X and P. X and P are usable to determine a ratio that represents a fraction of a clock cycle (e.g., X/P=1/8, 5/32, etc.) to delay the input signal IN. In some embodiments, after DLL 130 is locked, control codes CODE1 and CODE2 are provided to AU 115 for the calculation of control code CDDCDL.

DLL 130 is configured to generate a reference signal FDCO on signal path 152 having a frequency to be synchronized (i.e., locked) with a frequency $F_{DLL}$ of a clock signal CLK that is received on the clock input terminal of DLL 130 and coupled to signal path 172. The frequency locking operation is an iterative feedback process that adjusts reference signal FDCO until synchronized with the clock signal CLK. A general description of an iterative feedback process for adjusting reference signal FDCO is provided below. A more detailed description of an iterative feedback process applicable to adjusting reference signal FDCO is provided in U.S. Pat. No. 8,754,685.

To generate reference signal FDCO, DCO 150 is configured as a ring oscillator by having the output terminal coupled to the third input terminal via signal path 152. Otherwise, DCO 150 is a replica of DCDL 110. Because DCO 150 is a replica of DCDL 110, control code CODE1 and control CODE2 generated based on locking reference signal FDCO to clock signal CLK are usable by AU 115 to generate control code CDDCDL for calibrated control of DCDL 110.

Logic device 140 is a circuit configured to control operation of DLL 130 by responding to signals SUSPEND, RESUME, UP, and DOWN, and by generating signals CDDCO, START, STOP, CALC, CODE1, and CODE2, as discussed below. In some embodiments, logic device 140 is a finite state machine (FSM).

Logic device 140 is configured to control operation of DLL 130 by transmitting a start signal START or a stop signal STOP to DCO 150, divider 160, divider 170, and frequency detector 180 via line 144. In response to the stop signal STOP, DCO 150, divider 160, divider 170, and frequency detector 180 are configured to be inactive. In response to the start signal START, DCO 150, divider 160, divider 170, and frequency detector 180 are configured to be active to lock reference signal FDCO to clock signal CLK.

When DCO 150, divider 160, divider 170, and frequency detector 180 are activated by logic device 140, logic device 140 receives an up signal UP or a down signal DOWN from frequency detector 180 via signal path 182. In response to the up signal UP or the down signal DOWN, logic device 140 adjusts a control code CDDCO that corresponds to a value of a reference signal FDCO at signal path 152. Logic device 140 transmits the control code CDDCO to DCO 150 via signal path 142.

When activated by logic device 140, divider 160 is configured to receive the reference signal FDCO via signal path 152. Divider 160 also receives a division integer M from controller 120 on signal path 124. In response to receiving the reference signal FDCO and division integer M, divider 160 is configured to divide the reference signal FDCO by division integer M, thereby generating a divided reference signal FDCODIVM. Divider 160 outputs the divided reference signal FDCODIVM to frequency detector 180 via signal path 162.

When activated by logic device 140, divider 170 is configured to receive the clock signal CLK via signal path 172. Divider 170 also receives a division integer N from controller 120 on signal path 126. In response to receiving the clock signal CLK and division integer N, divider 170 is configured to divide the clock signal CLK by the division integer N, thereby generating a divided clock signal FCLKDIVN. Divider 170 outputs the divided reference signal FCLKDIVN to frequency detector 180 via signal path 174.

When activated by logic device 140, frequency detector 180 is configured to receive the divided reference signal FDCODIVM and divided clock signal FCLKDIVN. Frequency detector 180 compares signal FDCODIVM and signal FCLKDIVN to determine their frequency relationship to control the output phase of the DLL 130. Based on the frequency relationship of signal FDCODIVM and signal FCLKDIVN, frequency detector 180 transmits the up signal UP, the down signal DOWN, or no signal to logic device 140, thereby controlling the reference signal FDCO output by the DCO 150. In particular, in response to the up signal UP or the down signal DOWN, logic device 140 adjusts the control code CDDCO on signal path 142 based on the up signal UP or the down signal DOWN to change the reference signal FDCO that is generated by DCO 150.

In some embodiments, control code CODE1 corresponds to a first locked condition where DLL 130 is locked when the clock signal CLK is divided by a first predetermined value of division integer N, and control code CODE2 corresponds to a second locked condition where DLL 130 is locked when the clock signal CLK is divided by a second predetermined value of division integer N different from the first predetermined value. Various embodiments of the present disclosure are not limited by how control codes CODE1 and CODE2 are generated.

In particular, the time delay associated with CODE1 is based on $T_{LOW}=(N_{LOW}/M)*T_{DLL}$ and the time delay associated with CODE2 is based on $T_{HIGH}=(N_{HIGH}/M)*T_{DLL}$, where $T_{LOW}$ is the time delay for control code CODE1 based on the frequency $F_{DLL}$ of the clock signal CLK, $T_{HIGH}$ is the time delay for control code CODE2 based on the frequency $F_{DLL}$ of the clock signal CLK, M is a predetermined integer based on the frequency $F_{DLL}$ of the clock signal CLK, $N_{LOW}$ is a division integer related to the control code CODE1, $N_{HIGH}$ is a division integer related to control code CODE2, and $T_{DLL}$ is a time period associated with a frequency $F_{DLL}$ of clock signal CLK.

The DLL 130 is configured to continuously generate control codes CODE1 and CODE2 through iterations of a delay locking operation in which a first iteration of a delay locking operation is followed by a second iteration of a delay locking operation, which is in turn followed by the first iteration. The first iteration corresponds to one of CODE1 and $T_{LOW}$ based on division integer $N_{LOW}$ or CODE2 and $T_{HIGH}$ based on division integer $N_{HIGH}$. The second iteration corresponds to the other of CODE1 and $T_{LOW}$ based on division integer $N_{LOW}$ or CODE2 and $T_{HIGH}$ based on division integer $N_{HIGH}$.

Control codes CODE1 and CODE2 therefore represent two calibration points that define a linear relationship independent of the frequency used to obtain CODE1 and CODE2. Thus, when the frequency $F_{DLL}$ of the clock signal CLK changes, calibration at the new frequency can be achieved by setting the division integer M to be linearly related to the frequency $F_{DLL}$ of the clock signal, thereby allowing DLL 130 to continue operation without relocking to the new frequency. Table 1 illustrates example division integers for values $N_{LOW}$, $N_{HIGH}$, and M, and corresponding time delays $T_{LOW}$ and $T_{HIGH}$.

TABLE 1

| $F_{DLL}$ (MHz) | $T_{DLL}$ (ps) | $N_{LOW}$ | $N_{HIGH}$ | M | $T_{LOW}$ (ps) | $T_{HIGH}$ (ps) |
|---|---|---|---|---|---|---|
| 1067 | 938 | 44 | 172 | 128 | 322 | 1260 |
| 933 | 1071 | 44 | 172 | 146 | 324 | 1262 |
| 800 | 1250 | 44 | 172 | 170 | 324 | 1265 |
| 667 | 1500 | 44 | 172 | 204 | 323 | 1265 |
| 600 | 1667 | 44 | 172 | 227 | 322 | 1263 |
| 533 | 1875 | 44 | 172 | 256 | 323 | 1260 |
| 467 | 2143 | 44 | 172 | 292 | 323 | 1262 |
| 400 | 2500 | 44 | 172 | 341 | 323 | 1261 |
| 367 | 2727 | 44 | 172 | 372 | 323 | 1261 |
| 333 | 3000 | 44 | 172 | 409 | 323 | 1262 |
| 300 | 3333 | 44 | 172 | 455 | 322 | 1260 |
| 267 | 3750 | 44 | 172 | 512 | 322 | 1260 |
| 200 | 5000 | 44 | 172 | 682 | 323 | 1261 |

When the clock signal CLK is set to change from a first frequency $F_1$ to a second frequency $F_2$ due to a different operation mode, DLL 130 is reconfigured based on the second frequency $F_2$ without the frequency locking operation. In particular, DLL 130, initially configured based on division integers $M_1$, $N_{LOW1}$, and $N_{HIGH1}$, is configured to suspend operations and receive reconfiguration integers $M_2$, $N_{LOW2}$, and $N_{HIGH2}$ related to the second frequency $F_2$. After receiving the reconfiguration integers related to the second frequency $F_2$, DLL 130 is reconfigured based on the second frequency. After reconfiguring the DLL 130, the DLL 130 resumes operation while contemporaneously being synchronized to the second frequency $F_2$ without performing a relocking operation. The reconfiguration process of the DLL 130 based on the second frequency $F_2$ of the clock signal CLK will now be described using the devices of DLL 130 and controller 120.

After logic device 140 has locked to the first frequency $F_1$ of the clock signal CLK, logic device 140 is configured to generate and transmit control code CODE1 and control code CODE2 to AU 115. Logic device 140 is also configured to generate signal CALC, which is used by the AU 115 to trigger generation of control code CDDCDL based on control code CODE1 and control code CODE2 and parameters X and P. Logic device 140 transmits signal CALC to AU 115 via signal path 132, transmits control code CODE1 to AU 115 via signal path 134, and transmits control code CODE2 to AU 115 via signal path 136.

Logic device 140 is configured to receive a suspend signal SUSPEND or a permit signal RESUME from controller 120 via line 122. In response to receiving the suspend signal SUSPEND, logic device 140 is configured to finish any current iteration of a delay locking operation, and then suspend operation of DLL 130. In some embodiments, after receiving the suspend signal SUSPEND and finishing a current iteration of a delay locking operation, logic device 140 transmits stop signal STOP to DCO 150, divider 160, divider 170, and frequency detector 180 via signal path 144. In response to receiving stop signal STOP, divider 160 is configured to receive reconfiguration integer $M_2$ from controller 120 via signal path 124. In response to receiving stop signal STOP, divider 170 is configured to receive reconfiguration integers $N_{LOW2}$ and $N_{HIGH2}$ from controller 120 via signal path 126.

Controller 120 is configured to control and reconfigure DLL 130 when clock signal CLK changes due to a change in performance mode. Specifically, controller 120 is configured to reconfigure DLL 130 when the clock signal CLK is to change from the first frequency $F_1$ to the second frequency $F_2$, thereby entering a different performance mode. When the frequency of clock signal CLK changes, controller 120 is configured to deactivate logic device 140 by transmitting suspend signal SUSPEND via line 122.

After suspending logic device 140, controller 120 waits for the clock signal CLK to operate at the second frequency $F_2$. When the clock signal CLK is operating at the second frequency $F_2$, controller 120 is configured to provide a new division integer $M_2$ and new division integers $N_{LOW2}$ and $N_{HIGH2}$. In some embodiments, controller 120 is configured to determine new division integer $M_2$ and new division integers $N_{LOW2}$ and $N_{HIGH2}$. In some embodiments, controller 120 is configured to receive new division integer $M_2$ and new division integers $N_{LOW2}$ and $N_{HIGH2}$ from a system of which circuit 100 is a part. Specifically, controller 120 provides division integer $M_2$ to load into divider 160 based on the second frequency $F_2$. The division integer $M_2$ is linearly related to the second frequency $F_2$. In addition, controller 120 is configured to provide division integers $N_{LOW2}$ and $N_{HIGH2}$ to load into divider 170 based on the second frequency $F_2$. Controller 120 is configured to provide division integer $M_2$ to divider 160 via signal path 124 and to provide division integers $N_{LOW2}$ and $N_{HIGH2}$ to divider 170 via signal path 126.

After providing division integer $M_2$ to divider 160 and division integers $N_{LOW2}$ and $N_{HIGH2}$ to divider 170, controller 120 transmits resume signal RESUME to logic device 140 via line 122. In response to the resume signal RESUME, logic device 140 is reactivated, thereby causing logic device 140 to retransmit control codes CODE1 and CODE2 and signal CALC to AU 115 based on the frequency $F_2$. In response to receiving the delay codes, AU 115 recalculates the digital control code CDDDCL based on updated values of X and P, and transmits the updated control code CDDCDL to DCDL 110.

Once reactivated, logic device 140 transmits the start signal START to DCO 150, divider 160, divider 170, and frequency detector 180 via line 144. DCO 150 continues to generate the reference signal FDCO. Divider 160 receives and divides the reference signal FDCO by the division integer $M_2$ to generate the divided reference signal FDCODIVM. Divider 170 receives the updated clock signal CLK operating at the second frequency $F_2$ and divides the second frequency $F_2$ by division integers $N_{LOW2}$ and $N_{HIGH2}$ to generate the divided clock signal FCLKDIVN. Because the division integer $M_1$ and the division integer $M_2$ are linearly related to the second frequency $F_2$, the divided reference signal FDCODIVM from divider 160 for second frequency $F_2$ is substantially similar to the divided reference signal FDCODIVM from divider 160 for first frequency $F_1$.

Frequency detector 180 continues to receive divided reference signal FDCODIVM and divided clock signal FCLKDIVN and provide appropriate feedback to logic device 140 as described above.

Thus, the controller 120 is configured to keep DLL 130 locked to the clock signal CLK without performing a relocking operation to synchronize the DLL 130 to the second clock frequency $F_2$. Because the DLL 130 does not need to perform the relocking operation, which could take hundreds of clock cycles, power is saved by bypassing such an operation. Further, in some embodiments, power is conserved because DLL 130 quickly enters into a power savings mode, further conserving power.

Figure 2:
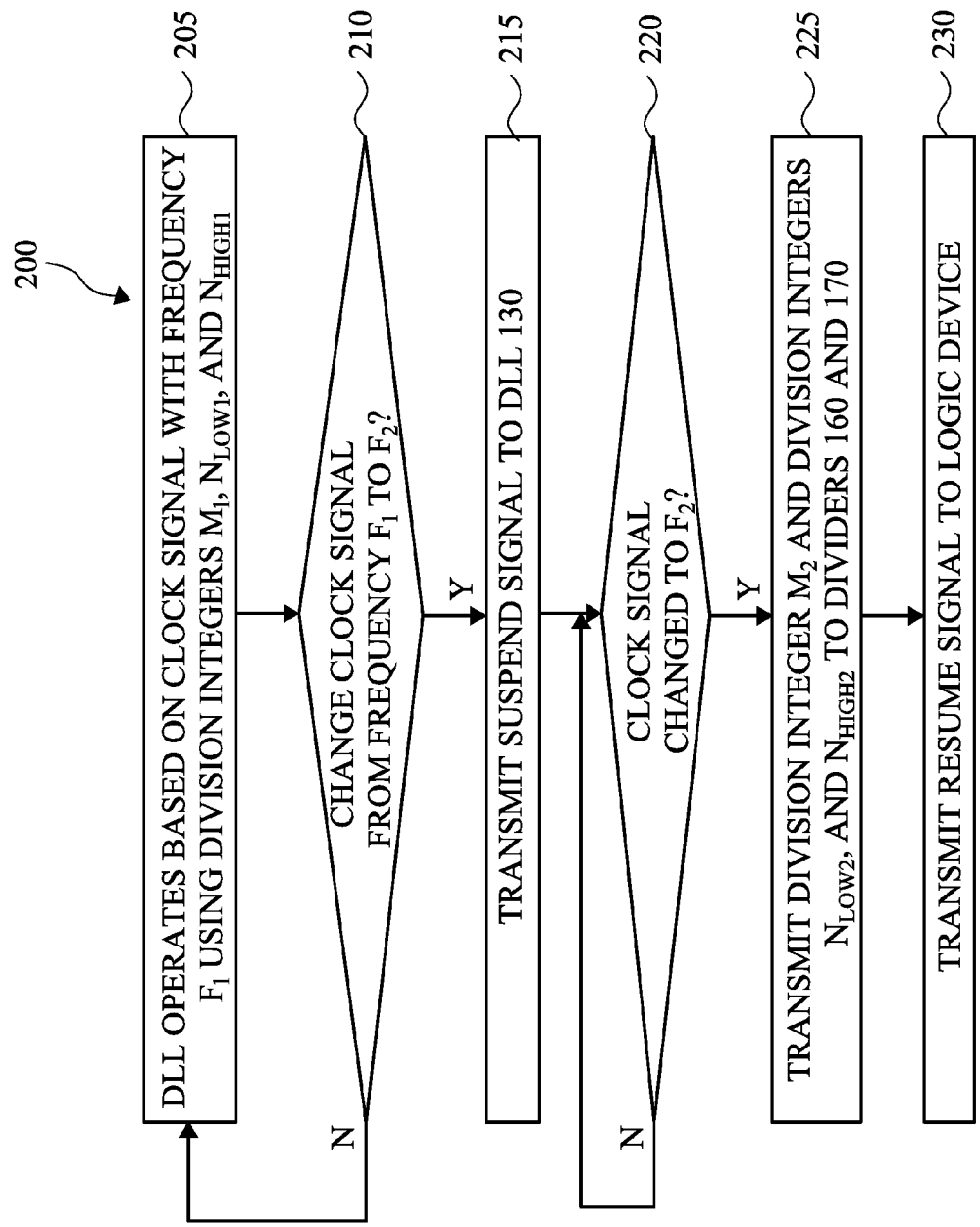
FIG. 2 is a flowchart of a method of controlling a delay locked loop (DLL) circuit to maintain a lock at a new operating frequency, in accordance with some embodiments.

FIG. 2 is a flowchart of a method 200 of controlling a DLL circuit to synchronize to a second frequency, in accordance with some embodiments. The method of FIG. 2 is usable by a controller, e.g., controller 120 (FIG. 1), in conjunction with a DLL, e.g., DLL 130.

Initially, the method 200 starts at operation 205, where a DLL, e.g., DLL 130, connected to a controller, e.g., controller 120, is operating based on a clock signal CLK that oscillates at frequency $F_1$ and with division integer $M_1$ being loaded into a first divider, e.g., divider 160, and division integers $N_{LOW1}$ and $N_{HIGH1}$ being loaded into a second divider, e.g., divider 170. At operation 210, the method determines if the clock signal CLK will change from the first frequency $F_1$ to a second frequency $F_2$. If the clock signal CLK will not change from the first frequency $F_1$ to the second frequency $F_2$ at operation 210, the method returns to operation 205 to continue operating based on the first frequency $F_1$.

If the clock signal CLK will change from the first frequency $F_1$ to the second frequency $F_2$ at operation 210, the method proceeds to operation 215, where the method transmits a suspend signal to the DLL. After transmitting the suspend signal, the method proceeds to operation 220, where the method determines if the clock signal CLK has changed to frequency $F_2$. If the clock signal CLK has not changed to the frequency $F_2$, the method returns to operation 220 and waits until the clock signal is changed to the frequency $F_2$.

After the clock signal is changed to the frequency $F_2$, the method proceeds to operation 225 where the method provides a new division integer $M_2$, new division integers $N_{LOW2}$ and $N_{HIGH2}$, and transmits the division integers $M_2$, $N_{LOW2}$, and $N_{HIGH2}$ to the DLL, e.g., DLL 130. The new division integers $M_2$, $N_{LOW2}$, and $N_{HIGH2}$ are based on the frequency $F_2$ and are related to delays that will be incurred when the DLL, e.g., DLL 130, operates at the frequency $F_2$. After transmitting the division integers $M_2$, $N_{LOW2}$, and $N_{HIGH2}$ in operation 225, the method continues to operation 230, where the method transmits a resume signal to a logic device, e.g., logic device 140, of the DLL, thereby causing the DLL to resume operation with the division integers $M_2$, $N_{LOW2}$, and $N_{HIGH2}$.

Figure 3:
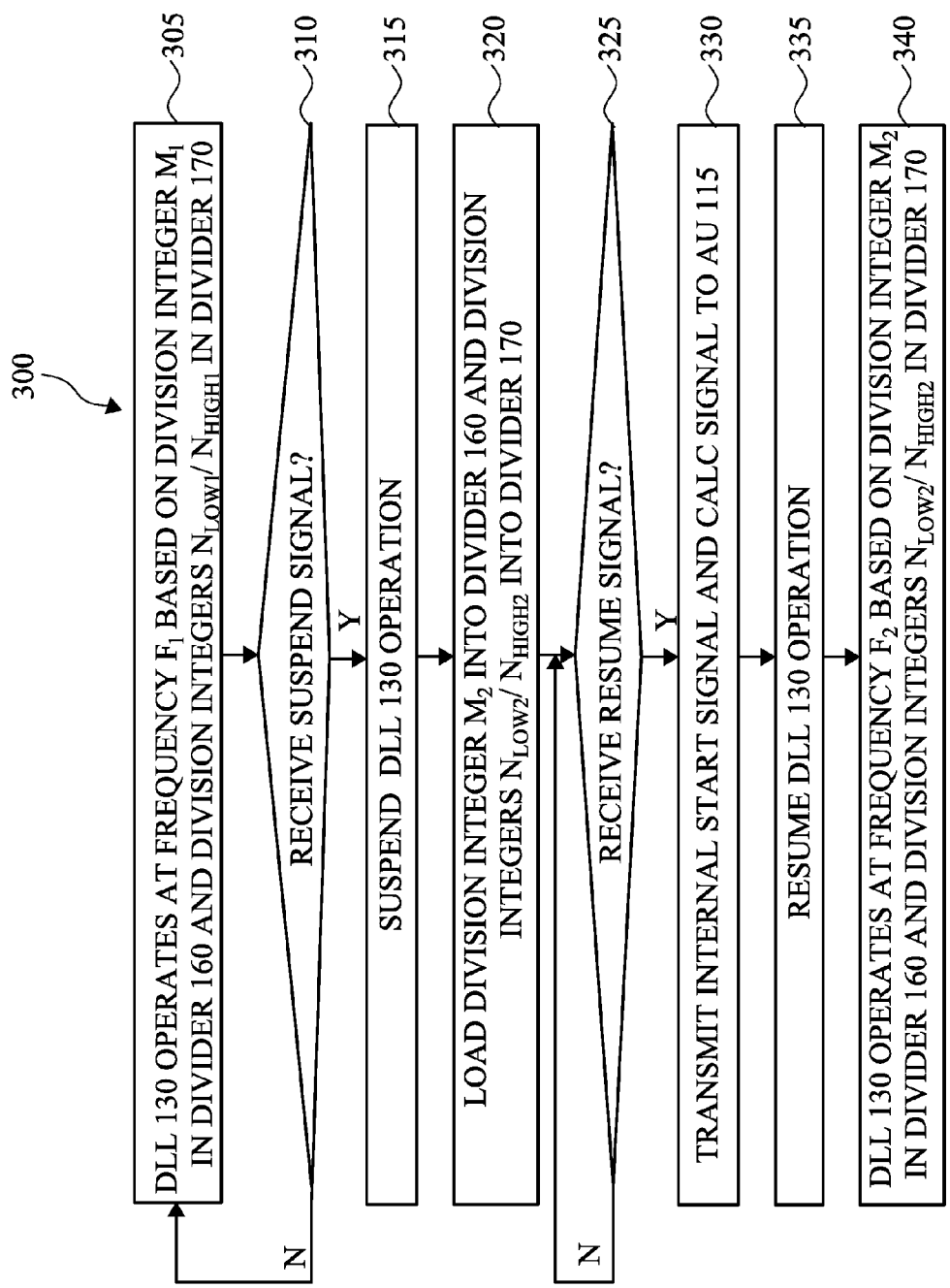
FIG. 3 is a flowchart of a method implemented by a DLL circuit to maintain a lock at a new operating frequency, in accordance with some embodiments.

FIG. 3 is a flowchart of a method 300 implemented by a DLL to synchronize to a second frequency, in accordance with some embodiments. The method of FIG. 3 is usable by a DLL, e.g., DLL 130 (FIG. 1), in conjunction with a controller, e.g., controller 120.

Initially, the method starts at operation 305, where a DLL is operating based on a clock signal CLK that oscillates at frequency $F_1$ and with division integer $M_1$ being loaded into a first divider, e.g., divider 160, and division integers $N_{LOW1}$ and $N_{HIGH1}$ being loaded into a second divider, e.g., divider 170. At operation 305, the DLL continues to adjust a DCO, e.g., DCO 150, to have a frequency and phase that is based on the clock frequency $F_1$, thereby continually causing an AU, e.g., AU 115, to update a DCDL, e.g., DCDL 110, to have delays based on the DCO, e.g., DCO 150. At operation 310, the method determines if a suspend signal has been received from a controller, e.g., controller 120. If a suspend signal has not been received at operation 310, the method returns to operation 305 to continue operating at frequency $F_1$.

If a suspend signal has been received at operation 310, the method suspends the DLL at operation 315. In some embodiments, suspending the DLL includes sending a stop signal, e.g., stop signal STOP, to a DCO, e.g., DCO 150, a first divider, e.g., divider 160, a second divider, e.g., divider 170, and a frequency detector, e.g., frequency detector 180 via signal path 144. After suspending the operation of the DLL, the DLL receives and loads division integer $M_2$ into the first divider and receives and loads division integers $N_{LOW2}$ and $N_{HIGH2}$ into the second divider at operation 320. The method proceeds to operation 325, where the method determines if a resume signal has been received. If the resume signal has not been received, the method returns to operation 325 to continue waiting until the resume signal is received.

When the resume signal is received at operation 325, the method proceeds to operation 330 where the DLL restarts operation of the DLL and transmits a CALC signal to the AU. In some embodiments, restarting operation of the DLL includes transmitting a start signal, e.g., start signal START, to a DCO, e.g., DCO 150, a first divider, e.g., divider 160, a second divider, e.g., divider 170, and a frequency detector, e.g., frequency detector 180 via signal path 144. After the DLL resumes operation, the method proceeds to operation 335 where the DLL operates at frequency $F_2$ based on the division integer $M_2$ in the first divider and division integers $N_{LOW2}$ and $N_{HIGH2}$ in the second divider. At operation 335, DLL continues to adjust the DCO to have a frequency that is based on the clock frequency $F_2$, thereby continually causing the AU to update a DCDL based on the DCO.

Figure 4:
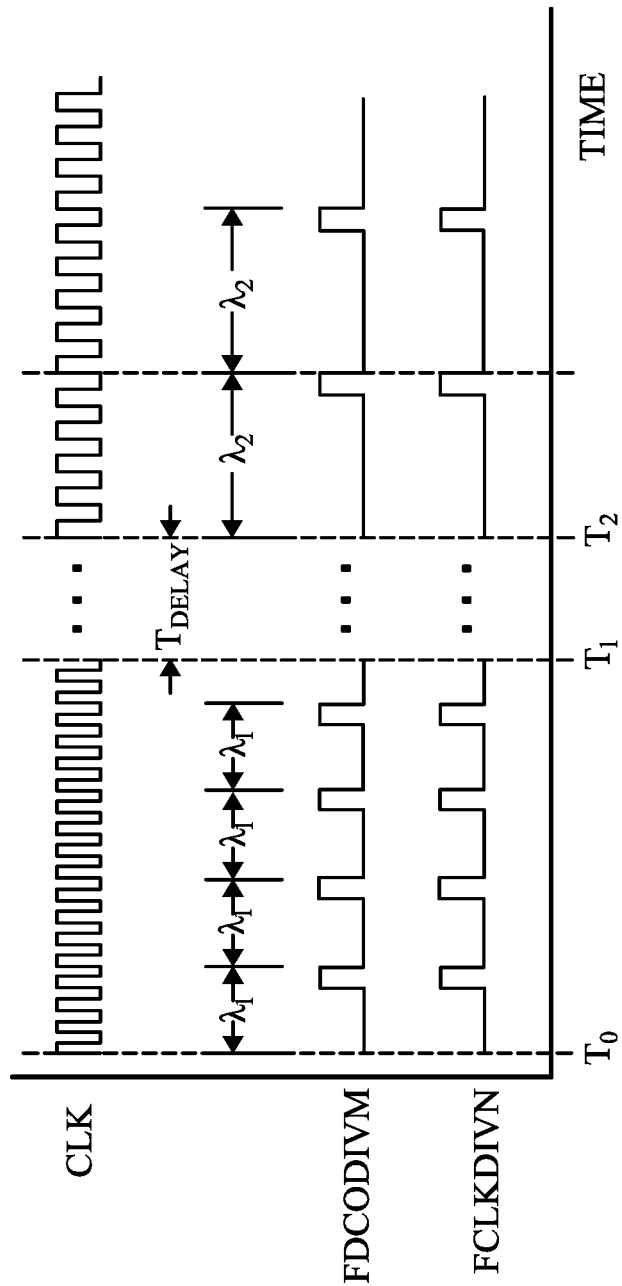
FIG. 4 is a graph of waveforms of various signals in the circuit of a delay circuit, in accordance with some embodiments.

FIG. 4 is a graph of waveforms of various signals in the DLL circuit of FIG. 1, in accordance with some embodiments.

At time $T_0$, the clock signal CLK is operating at frequency $F_1$ and divided reference signal FDCODIV and divided clock signal FCLKDIV operate at a fraction of frequency $F_1$, each having substantially equal frequency and phase with respect to the clock signal CLK. In particular, divided reference signal FDCODIV and divided clock signal FCLKDIV each have a time period $\lambda_1$, corresponding the time period of frequency $F_1$ divided by a first division integer.

At time $T_1$, the controller determines that the clock signal CLK is to change from frequency $F_1$ to frequency $F_2$. Accordingly, the controller suspends the operation of DLL at time $T_1$ until the clock signal CLK has stabilized to operate at frequency $F_2$. At time $T_2$, the controller determines that the clock signal CLK has stabilized to operate at frequency $F_2$. In response to the clock signal stabilizing at time $T_2$, the controller updates the DLL based on the division integers associated with the second frequency $F_2$. After updating the DLL with the division integers associated with the second frequency $F_2$, the controller transmits a resume signal RESUME to the DLL to resume operations based on the division integers associated with the second frequency $F_2$.

At time $T_2$, the clock signal CLK is operating at frequency $F_2$ and divided reference signal FDCODIV and divided clock signal FCLKDIV operate at a fraction of frequency $F_2$, with both reference clock FDCODIV and divided clock signal FCLKDIV having substantially equal frequency and phase with respect to the clock signal CLK. In particular, divided reference signal FDCODIV and divided clock signal FCLKDIV each have a time period $\lambda_2$, corresponding the time period of frequency $F_2$ divided by a second division integer. The time delay $T_{DELAY}$ for the DLL to change operating frequencies is substantially equal to the amount of time delay incurred to change the clock frequency from the first frequency $F_1$ to the second frequency $F_2$.

In some embodiments, a value of control code CDDCO is loaded to DCO 150. In response, DCO 150 oscillates at a frequency corresponding to the value of control code CDDCO loaded to DCO 150. When a value of control code CDDCO is to be adjusted, logic device 140 provides the adjusted value of control code CDDCO based on signals UP and DOWN generated by DET 170. For example, when logic device 140 receives signal UP, logic device 140 increases a value of control code CDDCO. In contrast, when logic device 140 receives signal DOWN, logic device 140 decreases a value of control code CDDCO. When logic device 140 does not receive signal UP or signal DOWN, and a time-out circuit (not shown) of the logic device 140 indicates a time out, frequency FDCODIVM and frequency FCLKDIVN are equal or are at least substantially close to one another. In such a condition, logic device 140 considers frequency FCLKDIVN and frequency FDCODIVM to be equal.

One aspect of this description relates to a delay circuit. The delay circuit includes a delay line configured to output an output signal by imposing a delay value on an input signal. The delay circuit further includes an arithmetic unit configured to calculate a control code for the delay value based on delay codes. The delay circuit further includes a delay locked loop (DLL) configured to generate the delay codes based on a clock signal. The delay circuit further includes a controller configured to suspend operation of the DLL when the clock signal operates at a first frequency, to set the DLL to operate based on a second frequency when the DLL is suspended, and to resume operation of the DLL when the clock signal operates at the second frequency.

Another aspect of this description relates to a method of operating a delay locked loop (DLL) in a delay circuit. The method includes suspending the DLL when a clock signal operates at a first frequency. The method further includes reconfiguring the DLL based on a first value and a second value corresponding to the clock signal operating at a second frequency different from the first frequency. The method further includes activating the DLL based on the first value and the second value after the clock signal operates at the second frequency.

Still another aspect of this description relates to a delay locked loop (DLL) configured to operate based on a clock signal having a first frequency or a second frequency. The DLL includes a logic device configured to generate a frequency control value, to generate delay codes based on the first frequency or the second frequency, to generate a first value, a second value, a third value, and a fourth value, and to suspend operations for a time duration responsive to a signal indicating changing the clock signal from the first frequency to the second frequency. The DLL further includes a digitally controlled oscillator (DCO) configured to generate a reference signal based on the frequency control value. The DLL further includes a first divider configured to divide the reference signal based on a first value when the clock signal having the first frequency and based on the third value when the clock signal having the second frequency. The DLL further includes a second divider configured to divide the clock signal based on a second value when the clock signal having the first frequency and based on the fourth value when the clock signal having the second frequency. The DLL further includes a frequency detector configured to compare the divided reference signal and the divided clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A delay circuit, comprising:
   a delay line configured to output an output signal by imposing a delay value on an input signal;
   an arithmetic unit configured to calculate a control code for the delay value based on delay codes;
   a delay locked loop (DLL) configured to generate the delay codes based on a clock signal; and
   a controller configured to suspend operation of the DLL when the clock signal operates at a first frequency, to set the DLL to operate based on a second frequency when the DLL is suspended, and to resume operation of the DLL when the clock signal operates at the second frequency.

2. The delay circuit of claim 1, wherein the DLL comprises:
   a digitally controlled oscillator configured to generate a reference signal;
   a first divider configured to divide the reference signal by a first value;
   a second divider configured to divide the clock signal based on a second value; and
   a frequency detector configured to compare the divided reference signal and the divided clock signal,
   wherein, when the DLL is suspended, the controller is configured to adjust the first value and the second value.

3. The delay circuit of claim 2, wherein the DLL is configured to generate the delay codes based on the second value and on the second divider dividing the clock signal based on a third value.

4. The delay circuit of claim 2, wherein the controller is configured to adjust the first value based on the second frequency.

5. The delay circuit of claim 2, wherein when the DLL is suspended, the controller is configured to adjust the second value based on the second frequency.

6. The delay circuit of claim 2, wherein the controller is directly connected to the first divider, and the controller is directly connected to the second divider.

7. The delay circuit of claim 1, wherein the delay codes are the same for the clock signal operating at the first frequency and the clock signal operating at the second frequency.

8. The delay circuit of claim 1, wherein, in response to resuming the operation of the DLL, the arithmetic unit is configured to recalculate the control code based on the delay codes and the second frequency.

9. A method of operating a delay locked loop (DLL) in a delay circuit, the method comprising:

suspending the DLL when a clock signal operates at a first frequency;

reconfiguring the DLL based on a first value and a second value corresponding to the clock signal operating at a second frequency different from the first frequency; and activating the DLL based on the first value and the second value after the clock signal operates at the second frequency.

10. The method of claim 9, further comprising determining the first value based on the second frequency.

11. The method of claim 9, further comprising outputting a first control code and a second control code while the clock signal operates at the first frequency.

12. The method of claim 11, further comprising outputting the first control code and the second control code while the clock signal operates at the second frequency.

13. The method of claim 9, wherein activating the DLL comprises outputting a calculate signal.

14. The method of claim 9, wherein activating the DLL comprises activating the DLL based on the first value and the second value when the DLL is not locked to the second frequency.

15. The method of claim 9, further comprising calculating a first control code and a second control code based on a first divided value of the first frequency and a second divided value of the first frequency or based on a first divided value of the second frequency and a second divided value of the second frequency.

16. A delay locked loop (DLL) configured to operate based on a clock signal having a first frequency or a second frequency, comprising:

a logic device configured to generate a frequency control value, to generate delay codes based on the first frequency or the second frequency, and to suspend operations for a time duration responsive to a signal indicating changing the clock signal from the first frequency to the second frequency;

a digitally controlled oscillator (DCO) configured to generate a reference signal based on the frequency control value;

a first divider configured to:
receive a first value and a second value; and
divide the reference signal based on the first value when the clock signal has the first frequency and based on the second value when the clock signal has the second frequency;

a second divider configured to:
receive a third value and a fourth value; and
divide the clock signal based on the third value when the clock signal has the first frequency and based on the fourth value when the clock signal has the second frequency; and a frequency detector configured to compare the divided reference signal and the divided clock signal.

17. The DLL of claim 16, wherein the logic device is configured to suspend operations when the clock signal changes from the first frequency to the second frequency.

18. The DLL of claim 16, wherein the logic device is configured to generate the delay codes when the DLL is not locked to the second frequency.

19. The DLL of claim 16, wherein the first value and the second value are linearly related based on the first frequency and the second frequency.

20. The DLL of claim 16, wherein the logic device is configured to generate the delay codes based on the first frequency that are the same as the delay codes based on the second frequency.

* * * * *